(12) United States Patent
Van De Beek

(10) Patent No.: US 8,014,487 B2
(45) Date of Patent: Sep. 6, 2011

(54) HIGH-FREQUENCY COUNTER

(75) Inventor: Remco C. H. Van De Beek, Eindhoven (NL)

(73) Assignee: NXP B.V., Eindhoven (NL)

( * ) Notice: Subject to any disclaimer, the term of this patent is extended or adjusted under 35 U.S.C. 154(b) by 35 days.

(21) Appl. No.: 12/595,036

(22) PCT Filed: Apr. 8, 2008

(86) PCT No.: PCT/IB2008/051332
§ 371 (c)(1),
(2), (4) Date: Oct. 7, 2009

(87) PCT Pub. No.: WO2008/122958
PCT Pub. Date: Oct. 16, 2008

(65) Prior Publication Data
US 2010/0066417 A1   Mar. 18, 2010

(30) Foreign Application Priority Data
Apr. 10, 2007   (EP) .................................. 07105853

(51) Int. Cl.
*G06M 3/00*   (2006.01)
*H03K 21/40*   (2006.01)
(52) U.S. Cl. ............................... 377/28; 377/30; 377/44
(58) Field of Classification Search .................. None
See application file for complete search history.

(56) References Cited

U.S. PATENT DOCUMENTS

| | | | | |
|---|---|---|---|---|
| 3,898,444 A | * | 8/1975 | Cordi et al. | 714/820 |
| 4,691,331 A | * | 9/1987 | Bayruns et al. | 377/47 |
| 4,993,051 A | * | 2/1991 | Feldbrugge | 377/28 |
| 5,339,345 A | * | 8/1994 | Mote, Jr. | 377/48 |
| 5,402,458 A | * | 3/1995 | Moughanni et al. | 377/29 |
| 5,487,093 A | | 1/1996 | Adresen et al. | |
| 6,661,864 B2 | * | 12/2003 | Ishiwaki | 377/28 |
| 6,826,249 B1 | * | 11/2004 | Younis | 377/46 |
| 7,760,843 B2 | * | 7/2010 | Boerstler et al. | 377/47 |
| 2003/0169841 A1 | | 9/2003 | Van Der Valk | |

FOREIGN PATENT DOCUMENTS

| | | |
|---|---|---|
| DE | 10 2004 006996 A1 | 9/2005 |
| EP | 238747 A2 | 9/1987 |
| EP | 631391 A1 | 12/1994 |

OTHER PUBLICATIONS

Staszewski, R. B., et al; "All-Digital TX Frequency Synthesizer and Discrete-Time Receiver for Bluetooth Radio in 130-NM CMOS"; IEEE Journal of Solid-State Circuits, vol. 39, No. 12 (Dec. 2004) (Cited in Int'l Search Report for PCT/IB2008/051332 As Balsara P T et al; "All-Digital TX . . .")
Da Dalt, N., et al; "A Compact Triple-Band Low-Jitter Digital LC PLL With Programmable Coil in 130-NM CMOS"; IEEE Journal of Solid-State Circuits, vol. 40, No. 7, (Jul. 2005).
"International Search Report for Application No. PCT/IB2008/051332"; Published as WO 2008/133958 A3 (Oct. 16, 2008).

* cited by examiner

Primary Examiner — Tuan Lam

(57) ABSTRACT

A counter circuit and method of controlling such a counter circuit, including a first counting section that counts in accordance with a state-cycle, and a second counting section clocked by the first counting section. At least one invalid counting state is introduced by controlling the second counting section to change its state before the first counting section has completed the state-cycle; and the invalid counting state is then detected and corrected. Thereby, some redundancy is introduced in the counter, which can be used to detect and correct incomplete switching of counter states.

11 Claims, 5 Drawing Sheets

| Input: S1 S0 | Corrected Input | Count decoder out: |
|---|---|---|
| 00 | 00 | 0 |
| 01 | 01 | 1 |
| 02 | 02 | 2 |
| 03 | 13 | 3 |
| 13 | 13 | 3 |
| 10 | 10 | 4 |
| 11 | 11 | 5 |
| 12 | 22 | 6 |
| 22 | 22 | 6 |
| 23 | 23 | 7 |
| 20 | 20 | 8 |
| 21 | 31 | 9 |
| 31 | 31 | 9 |
| 32 | 32 | 10 |
| 33 | 33 | 11 |
| 30 | 00 | 0 |

HIGH-FREQUENCY COUNTER

FIELD OF THE INVENTION

The present invention relates to a transceiver, receiver module, computer program product and method for compensating frequency-dependent delay in a transceiver.

BACKGROUND OF THE INVENTION

In communication systems, frequency synthesizers can be used for frequency conversion. Recently, all-digital implementations of phase-locked loop (PLL) circuits (for example to realize frequency synthesizers) have gained a lot of attention. Examples of such all-digital implementations are described for example in R. B. Staszewski et al, "All-Digital TX Frequency Synthesizer and Discrete-Time Receiver for Bluetooth Radio in 130-nm CMOS", IEEE Journal of Solid-State Circuits, December 2004, and N. Da Dalt et al, "A Compact Triple-Band Low-Jitter Digital LC PLL With Programmable Coil in 130-nm CMOS", IEEE Journal of Solid-State Circuits, July 2005. In such a PLL, the phase detector is a digital building block, i.e., its output signal is available as a time and amplitude discrete quantity, which allows use of a digital loop filter. This has several benefits, such as lower loop filter area (i.e. lower chip cost), simplified portability to newer technologies, flexibility of PLL bandwidth, faster lock times and possibly output spectral accuracy improvement.

FIG. 2 shows a general block diagram of an example of an all-digital PLL circuit. A digitally controlled oscillator (DCO) 70 outputs a desired frequency N*Fref which is the N-fold of an input reference frequency Fref. A digital loop filter 60 clocked by the reference frequency Fref generates frequency control words for the DCO 70.

In order to be able to use a simple phase detector (such as a bang-bang phase detector), some form of frequency detection is needed to avoid locking to the wrong output frequency. This is provided by the counters 20, 32 in FIG. 2. A high speed +1-counter 32 is clocked by the DCO output N*Fref and is actually used as a phase detector with a range larger than ±360 degrees (the actual range depends on the number of bits in the counter), also known as a phase accumulator. Because the accumulator only changes value due to the oscillator edges, the phase accumulator has a quantization error that can range between ±1 oscillator period. The output of the +1-counter 32 is sampled by a register 40 at the lower reference frequency Fref and subtracted from an output of a +N-counter 20 which has a quantization step corresponding to N oscillator periods and is clocked by the reference frequency Fref. Together with the phase detector (PD) 10 accurate phase lock can be achieved (due to the fine phase detection operation at the PD 10) at the correct frequency (due to the phase accumulator, i.e. the +1-counter 32).

However, when trying to use the +1-counter 32 at high input (oscillator) frequencies NFref, a problem is encountered. If a synchronous +1-counter 32 is used (i.e. all internal flip-flops are clocked by the oscillator frequency NFref), which has enough bits to guarantee locking to the correct frequency, long internal loops exist to handle the internal carry signals, which limit the operation speed. Also, the power consumption of such a counter tends to be high.

On the other hand, if an asynchronous counter topology (where all internal flip-flops change state at different moments in time, e.g., in a ripple counter) is used to overcome these problems, another problem is faced. Because the PLL reference signal samples the complete counter output as one single value at a certain moment in time, the first flip-flops in the asynchronous counter may have already changed value, while others did not do so yet, due to internal flip-flop delays, thus causing a completely wrong value to be read out of the counter and causing the PLL to be controlled in the wrong direction. In the following, this phenomenon is called a "glitch".

FIG. 3 shows a schematic block diagram of an asynchronous 3-bit counter (i.e. 3-bit ripple counter) consisting of three toggle flip-flop circuits 320-322 that change their state (i.e. toggle) at each falling edge of their input clock. Of course, the flip-flop circuits could as well be designed to change state at the rising edge. An oscillator frequency Fosc is supplied to a clock input of the first flip-flop circuit 320. Due to the asynchronous nature of this counter, the output S0 of the first flip-flop circuit 320 is supplied to a clock input of the second flip-flop circuit 321 and the output S1 of the second flip-flop circuit is supplied to a clock input of the third flip-flop circuit 322 with an output S2.

FIG. 4 shows a state diagram that illustrates the above-mentioned glitch problem in such asynchronous counter topologies. Each row in this schematic table indicates the state of the different sections (i.e. toggle flip-flops 320-322 in this case), the upper row represents the state or output S0 of fastest running flip-flop circuit 320 (which can be seen as a 1-bit counter), the row below indicates the state or output S1 of the counter clocked by the fastest and so on. The small and short vertical lines indicate the switching instances of each particular section or counter stage (i.e. flip-flop circuit), where the delay of the counter stages is shown by the fact that the vertical lines occur at different time instances for each counter stage. The bold and long vertical lines depict sampling instances (examples) and clarify the glitch problem, caused by internal delays. In the present example, the last binary output sample should have been "000" (in the absence of any delays), but in fact the last counting section (i.e. flip-flop circuit 322) did not toggle yet, resulting in an erroneous output sample "100" that cannot be detected in principle. There is no way of knowing that the counter was not in fact supposed to be in the state "100".

Using a frequency divider between the oscillator and the counter (thus reducing the input frequency of the counter) does not solve this glitch problem in a satisfactory manner, because the lowered frequency increases the quantization error of the accumulator-based phase detector of FIG. 2 and, with that, the PLL lock time may be increased. The PLL reacts most accurately to errors if they are most accurately measured.

SUMMARY OF THE INVENTION

An object of the present invention is to provide a counter circuit and counter control method, by means of which the above problem of incomplete switching can be solved in a satisfactory manner.

This object is achieved by a counter circuit and by a control method. The invention is defined by the independent claims. Dependent claims describe advantageous embodiments.

Accordingly, some redundancy is introduced in the counter, which can be used to detect incomplete switching states of the counter and to output the correct value of the accumulated phase by correcting the error. This correction can be achieved by a simple decoding operation. A counting section that is thus clocked by a previous counting section does not change state when the previous section has completed its full state-cycle, but somewhat earlier (which causes the redundancy), using some extra logic in the counter. Thus, there is a certain overlap in the state rotations of the counting sections. This causes certain states (occurring at the glitches) to be invalid (because they can be shown not to occur if all electronics were delay-free) and these states can be detected. The sampled states can thus be corrected in order to give a correct count value.

The first and second counting sections may output at least two bits to indicate their state. Thereby, the logic circuit can easily detect based on predefined bit combinations where to introduce invalid counting states. In a specific example, input and output signals of the second counting section may comprise in-phase and quadrature phase components.

Furthermore, the second counting section may be arranged to change its state one or more states before the first counting section has completed its state-cycle. This ensures that the at least one invalid counting state is introduced in synchronism with the state-cycle and can thus be easily detected.

The logic circuit may be provided as an internal logic of the second counting section. In an exemplary implementation, the internal circuit may be adapted to switch an output state of the second counting section in response to an input state transition and at least one state of the second counting section. The introduction of the at least one invalid state can thus be achieved simply by logically combining input states of the second counting section in a logical circuit or logic gates to derive or set a desired output state according to the at least one invalid counting state.

The decoder may operate on a sampled output of the complete counter in some applications, including all-digital PLLs, so that its operating speed can be kept low and allows low-speed digital design.

As an additional option, at least one of said first and second counting sections may comprise a first counting sub-section for counting in accordance with a state-cycle, a second counting sub-section clocked by the first counting sub-section, a logic sub-circuit for introducing at least one invalid counting state by controlling the second counting sub-section to change its state before the first counting section has completed the state-cycle; and a sub-decoder for detecting and correcting the at least one invalid counting state. Thus, the first or second counting section can themselves be based on the proposed redundancy scheme to prevent glitch errors during their counting cycles.

Further advantageous embodiments are described in the dependent claims.

BRIEF DESCRIPTION OF THE DRAWINGS

In the following, the present invention will be described in greater detail based on embodiments with reference to the accompanying drawings in which.

DESCRIPTION OF THE EMBODIMENTS

The embodiments of the present invention will now be described in greater detail based on a PLL frequency synthesizer with an all-digital implementation of the PLL circuit.

In the embodiments, some redundancy is introduced in the counter circuit, which is used to detect incomplete switching of the counter state and to give the correct counting value of the accumulated phase by correcting the error. This correction can be done by using a decoder that is used after the sampler (e.g. register 40 in FIG. 2) driven by the reference frequency Fref and thus at considerably lower speed than the counter itself.

Figure 1:
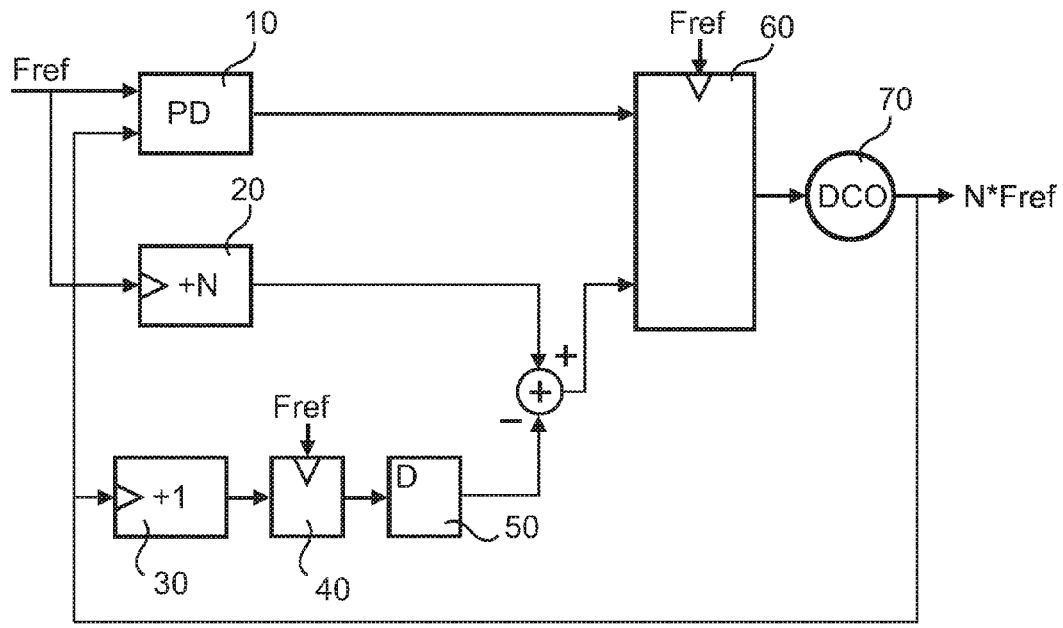
FIG. 1 shows a schematic block diagram of an all-digital PLL circuit according to an embodiment.

FIG. 1 shows a schematic block diagram of a PLL based frequency synthesizer according to an embodiment. Those components of FIG. 1, which have identical in reference numerals as those of FIG. 2 have same or similar functionalities and are therefore not explained again for brevity reasons. The proposed +1-counter 30 comprises asynchronously clocked counting sections, where the faster running counting sections clock the slower ones. Each counting section outputs at least two bits to indicate its state. A counting section that is clocked by a previous counting section does not change state when the previous section has completed its full state-cycle, but one or more states earlier (which causes the redundancy), using some extra internal logic in the asynchronously clocked counting section(s). Thus, there is a certain overlap in the state rotations or state-cycle of the counters. This causes certain states (occurring at the glitches) to be invalid, because they can be shown not to occur if all electronics were delay-free. These invalid states can be then detected, e.g., by hardware. The sampled invalid states can thus be corrected in order to give a correct count value.

In FIG. 1, the +1-counter 30 is thus arranged as a counter with added redundancy due to the introduced invalid states which however provide a detection and correction capability. The sampled output of the register 40 is supplied to a decoder 50 which detects and corrects invalid counter state(s). This may be achieved by a simple logical network arranged to receive output samples of the register 40 and to convert invalid output patterns into correct output patterns. Instead of a logical network, a lookup table or other memory could be used to store associations between invalid output samples and correct samples of the counter.

Figure 3:
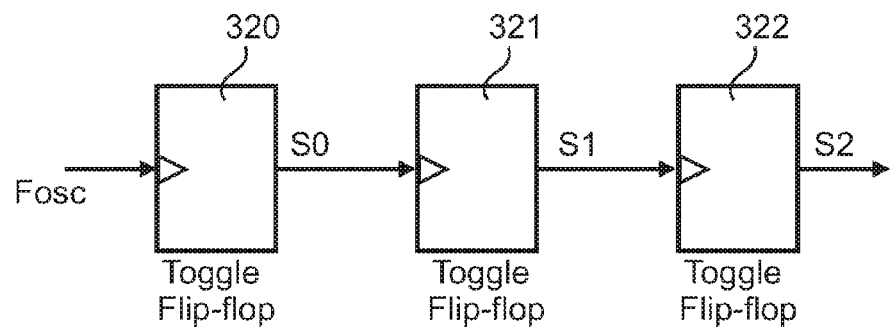
FIG. 3 shows a block diagram of a 3-bit asynchronous counter.
Figure 5:
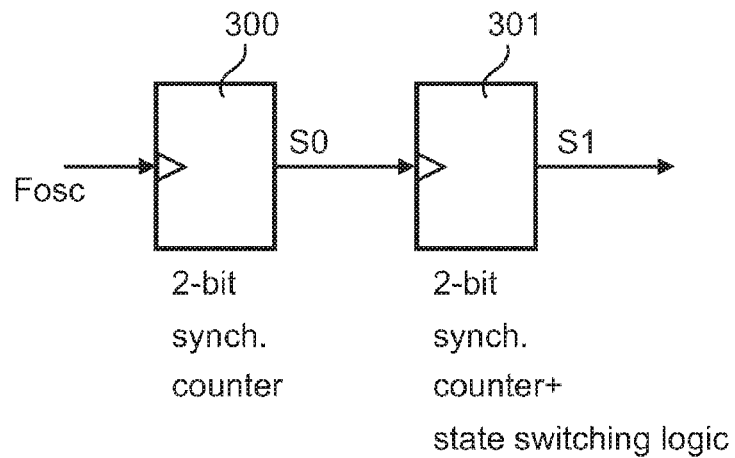
FIG. 5 shows a block diagram of a counter circuit with two counting sections according to an embodiment.

FIG. 5 shows a simple example of a two-section counter, which may be used as the +1-counter 30 of FIG. 3. Both counting sections 300 and 301 are two bit counters and thus rotate through four states, namely binary "00" (or decimal "0"), binary "01" (or decimal "1"), binary "10" (or decimal "2"), and binary "11" (or decimal "3"). In a classic asynchronous counter, the second counting section would change state each time the first counter has completed its four-state rotation, i.e., at the transition from the decimal value "3" back to the decimal value "0". According to the embodiment, however, the second counting section changes its state earlier (in this example, after three state changes of the first section). Each of the counting sections 300 and 301 are 2-bit synchronous counters, while the second counting section 301 comprises some state switching or setting logic, as explained later in more detail based an exemplary implementation.

Figure 2:
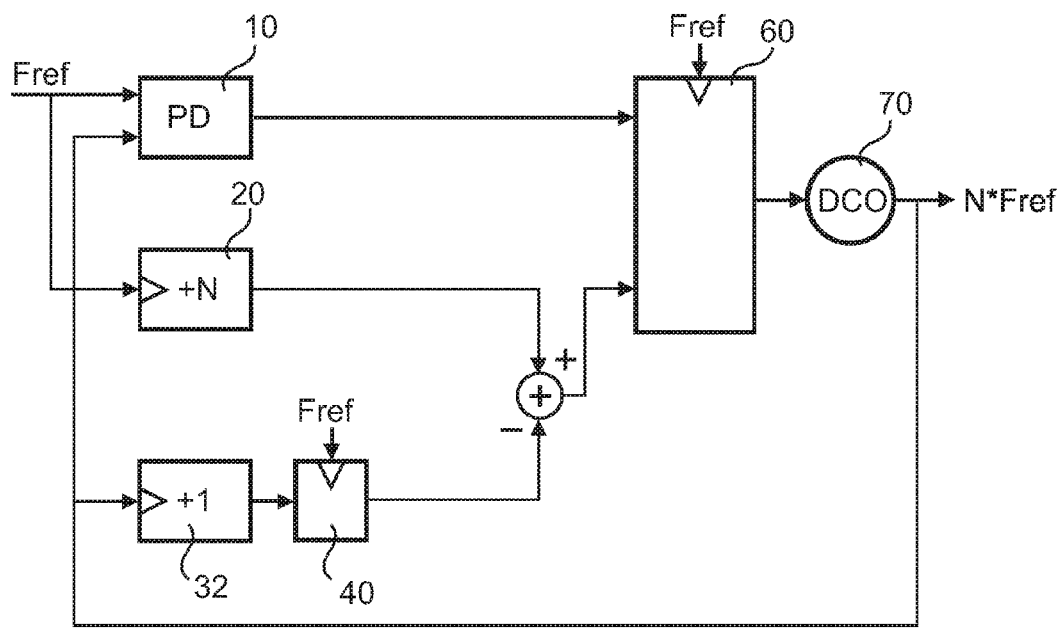
FIG. 2 shows a schematic block diagram of an all-digital PLL in which synchronization errors due to incomplete switching can occur.
Figure 4:
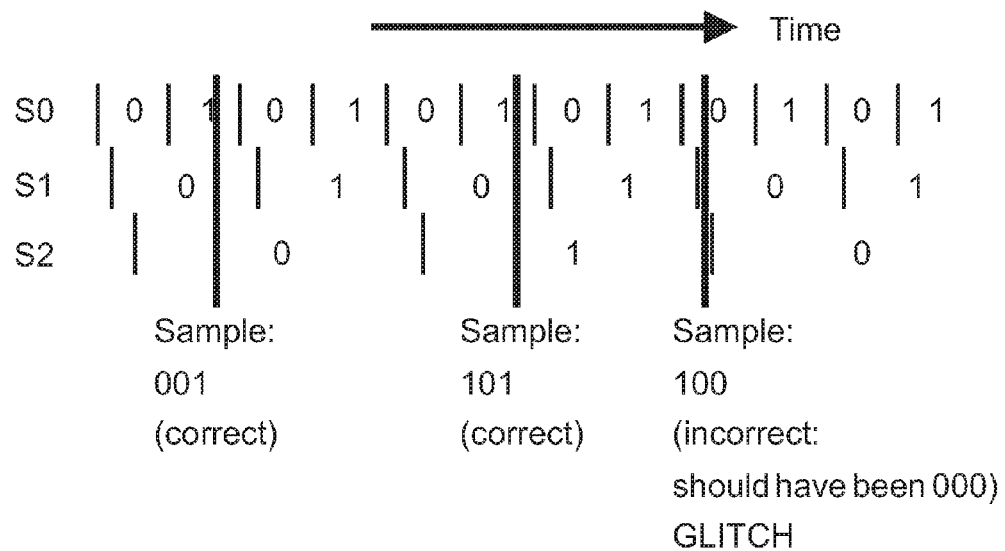
FIG. 4 shows a state diagram that illustrates the incomplete switching problem in asynchronous counter topologies.
Figure 6:
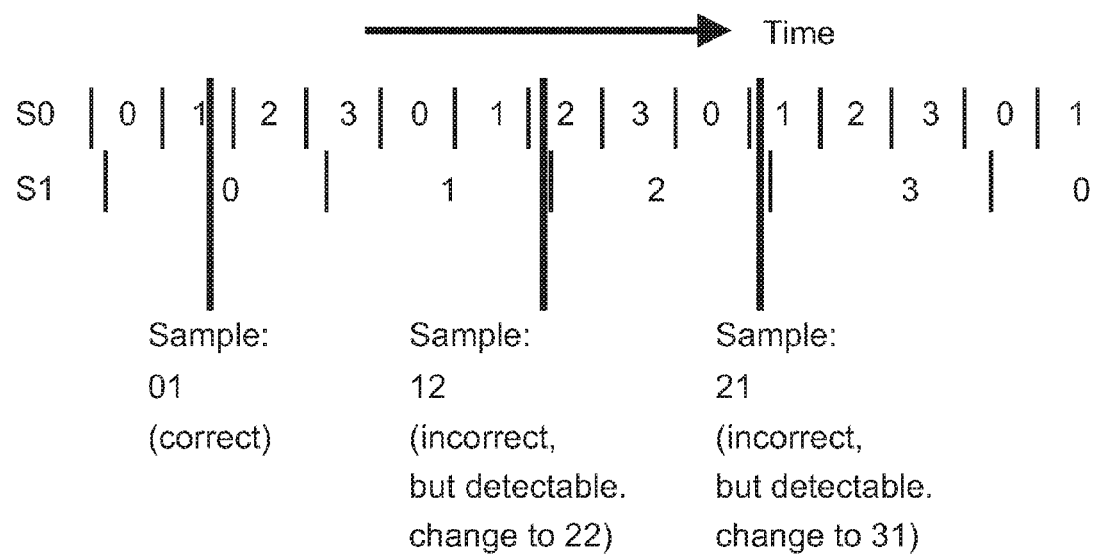
FIG. 6 shows a state diagram of an improved counter according to an embodiment with detectable and correctable glitches.

FIG. 6 shows a state diagram with individual switching delays causing incomplete switching which can however be detected and corrected due to the introduced redundancy. The diagram layout and structure corresponds to that of FIG. 4. However, decimal counting values ("0" . . . "3") are shown here. Switching earlier than in the classic +1-counter 32 of FIG. 2 is achieved by some extra logic which may be introduced e.g. in the second counting section 301.

It is however noted that the proposed enhanced +1-counter with the two successive 2-bit counting sections 300 and 301 looses four of its sixteen counting states compared to a conventional asynchronous counter. These are the introduced invalid states that need to be corrected by the decoder 50. Thus, in case of the present exemplary two 2-bit counting sections 300 and 301 of FIG. 5, a count-to-12 rather than a count-to-16 is achieved by the added redundancy, and in return the enhanced counter does not have any uncorrectable glitches and can therefore be implemented in an asynchronous manner to improve operating speeds and power consumption compared to its synchronous counterpart.

In the example of FIG. 6, an output sample "12" is obviously a glitch, as this state would not occur in this counter if delay were not present. This invalid counting value can thus deduce that the counting section that delivers signal S1 did not switch yet. Hence, the invalid counting value can be detected and corrected. Similarly, sampled state "21" is not valid and can be corrected to "31".

Figures 7, 8:
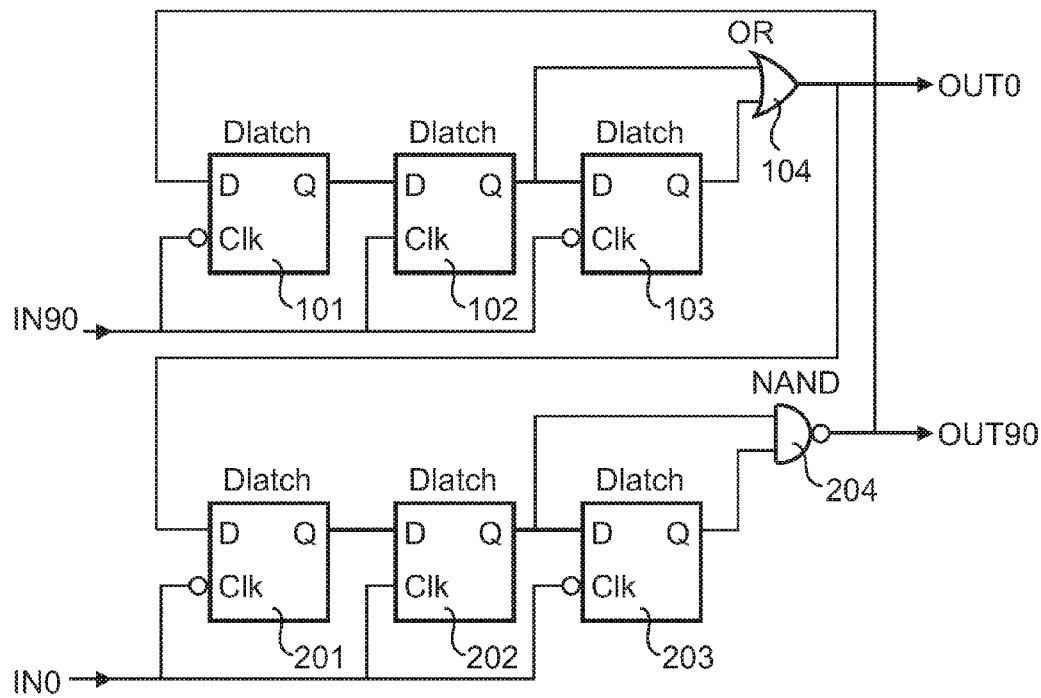
FIG. 7 shows a table indicating operation of a decoder according to the embodiment.
FIG. 8 shows a logic circuit diagram of an exemplary implementation of the second counting section according to the embodiment.

FIG. 7 shows a table indicating operation of the decoder 50 according to the embodiment. In this table an operation of the decoder is shown, that determines the actual counter value from the sampled state and corrects the counter glitches, i.e., invalid counting values or states. Since this table is a 1-to-1 mapping, the implementation can be done by simple logic functions with digital gates or by a look-up table.

According to the table of FIG. 7, possible decoder input values S0, S1 are sequentially listed in the first column. In the second column, corrected input values as generated by the decoder 50 are listed, and in the third column, corresponding decimal count values which may generated at the output of the decoder 50 are shown. The lines of the table, which are filled with bold values (i.e., input values "03", "12", "21" and "30") indicate invalid counting states which are corrected by the decoder to the corrected values "13", "22", "31" and "00", respectively.

In the embodiment, the decoder 50 operates on the sampled counter output rather than at the full oscillator speed (cf. sample period of FIG. 6 and register 40 of FIG. 1), it can be implemented using standard digital design methodology and its speed is usually not critical.

It is noted that FIGS. 5 and 7 are merely intended as examples. The second counter or counting section 301 and also the first counter or counting section 300 could in fact be counters or counting sections with more than two bits and could themselves be built up using the same proposed redundancy with introduction of invalid counting states. Also, the switching of the second counting stage 301 could also occur after two or more state changes of the first counter for example, or even after fractional periods of the counting cycle, provided the logic circuit and/or decoder are correspondingly adapted. The first counting section 300 could also have more than two bits. In general, the counter is divided into two or more sections and invalid states are introduced, that occur while synchronously changing state, which enables detection and correction of glitch errors or other incomplete switching states.

FIG. 8 shows a logic circuit diagram of an exemplary implementation of the second counter section 301. This circuit is adapted to switch its counting state depending on an input state transition and its own state, which is required for this ID. In this example, the input signal of the second counting section 301 is a quadrature signal comprising an in-phase component IN0 and a quadrature component IN90 and coming from a divide-by-4 (which is a count-to-four circuit) as the first counting section 300. This count-to-4 stage (not shown in FIG. 8) has thus four states, indicated by two corresponding (quadrature) output signals which correspond to the IN0 and IN90 signals at the input of the circuit of FIG. 8.

As can be gathered from FIG. 8, two sets of three serially connected D-latches 101 to 103 and 201 to 203 are provided in a synchronous topology (i.e. common clock signal) for each component of the quadrature signal. The D-latches change their output state at each clock period. In general, a latch is a level sensitive building block, meaning that it is transparent when the clock signal is at high level for example and acts as a memory when the clock signal is at low level, or vice versa in case of a negated clock input. Thus, two cascaded D-latches with respectively inverted clock sensitivity together form a D-flip flop. In the present implementation example, the Q outputs of the second and third D-latches 102 and 103 of the upper set for the in-phase component are logically combined by an OR gate 104, so that the in-phase output OUT0 is set to "1" whenever at least one of the above two latch outputs has a logical state "1". Additionally, the Q outputs of the second and third D-latches 202 and 203 of the lower set for the quadrature component are logically combined by a NAND gate 204, so that the quadrature phase output OUT90 is set to "1" whenever at least one of the above two latch outputs has a logical state "0". Thereby, invalid counting states can be introduced at predefined internal states of the second counting section 301. Of course, the logic circuit is in no way restricted to the above OR and NAND gates 104, 204. Any suitable logic circuit or look-up table could be used to generate the desired logical behavior.

Figure 9:
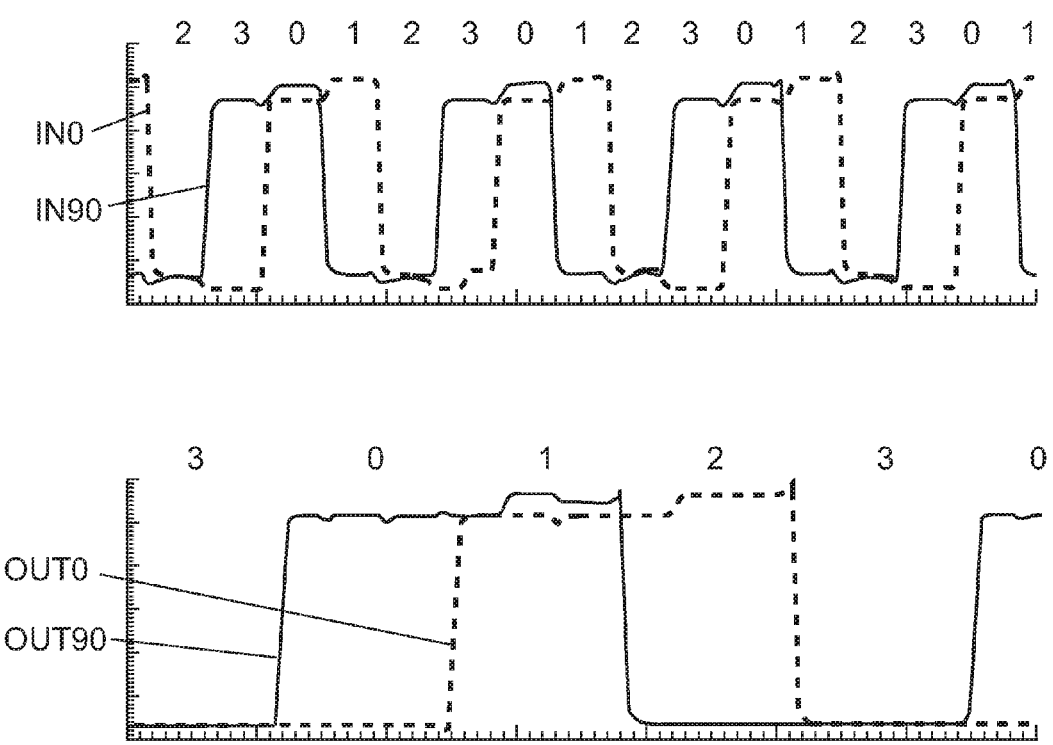
FIG. 9 shows waveform patterns of input and output signals of the exemplary implementation.

FIG. 9 shows waveform patterns of the input component signals IN0 and IN90 and output component signals OUT0 and OUT90 of the above exemplary implementation of FIG. 8. As can be gathered from these waveform patterns, the state transitions of the second counting section 301 (i.e. output component signals OUT0 and OUT90) occurs at different transition timings than those of the first counting section 300 (i.e. output component signals IN0 and IN90). Thus, redundancy is created with a corresponding possibility for glitch detection and correction.

It is noted that the proposed solution can be used in a wide spectrum of communication systems where frequency synthesis is used. The technique is especially suitable in high-frequency systems such as for example ultra wideband (UWB) systems operating in the higher part of the 3-10 GHz spectrum.

In summary, a counter circuit and method of controlling such a counter circuit have been described, wherein a first counting section or counter counts in accordance with a state-cycle, and a second counting section or counter is clocked by the first counting section. At least one invalid counting state is introduced by controlling the second counting section to change its state before the first counting section has completed the state-cycle, and then the at least one invalid counting state is detected and corrected. A solution is thus proposed that uses an asynchronous counter with internal redundancy that can be sampled at any instant in time to represent the counted value without producing glitches that would be otherwise present in an asynchronous counter whose state is sampled. A decoder can be used for error correction. Thereby, some redundancy is introduced in the counter, which can be used to detect and correct incomplete switching of counter states.

However, in general, the present invention is not restricted to the above embodiments or application examples and can be implemented in any counter circuit arrangement or integrated architecture. The proposed detection and correction can be applied to any kind of regular or irregular counting sequence. It applies for all general purpose and special commercial products (like integrated circuits used in consumer electronics, mobile phones, radar devices, etc.). The above embodiments may thus vary within the scope of the attached claims.

Finally, it is noted that the term "comprises" or "comprising" when used in the specification including the claims is intended to specify the presence of stated features, means, steps or components, but does not exclude the presence or addition of one or more other features, means, steps, components or group thereof. Further, the word "a" or "an" preceding an element in a claim does not exclude the presence of a plurality of such elements. Moreover, any reference sign does not limit the scope of the claims.

The invention claimed is:

1. A counter circuit comprising:
    a first counting section for counting in accordance with a state-cycle;
    a second counting section clocked by said first counting section;
    a logic circuit for introducing at least one invalid counting state by controlling said second counting section to change its state before said first counting section has completed said state-cycle; and
    a decoder for detecting and correcting said at least one invalid counting state.

2. The counter circuit according to claim 1, wherein said first and said second counting sections output at least two bits to indicate their state.

3. The counter circuit according to claim 1, wherein said second counting section is arranged to change its state at least one state before said first counting section has completed said state-cycle.

4. The counter circuit according to claim 1, wherein said logic circuit is provided as an internal logic of said second counting section.

5. The counter circuit according to claim 4, wherein said internal logic is adapted to switch an output state of said second counting section in response to an input state transition and at least one state of said second counting section.

6. The counter circuit according to claim 5, wherein input and said output signals of said second counting section comprise in-phase and quadrature phase components.

7. The counter circuit according to claim 1, wherein said decoder operates on a sampled output of said second counting section.

8. The counter circuit according to claim 1, wherein at least one of said first and second counting sections comprises a first counting sub-section for counting in accordance with a state-cycle, a second counting sub-section clocked by said first counting sub-section, a logic sub-circuit for introducing at least one invalid counting state by controlling said second counting sub-section to change its state before said first counting section has completed said state-cycle; and a sub-decoder for detecting and correcting said at least one invalid counting state.

9. A frequency synthesizer comprising a counter circuit according to claim 1.

10. A frequency synthesizer according to claim 9, wherein said counter circuit is arranged in an all-digital phase locked loop circuit.

11. A method of controlling a counter circuit, said method comprising:
    counting in a first counting section in accordance with a state-cycle;
    clocking a second counting section by using said first counting section;
    introducing at least one invalid counting state by controlling said second counting section to change its state before said first counting section has completed said state-cycle; and
    detecting and correcting said at least one invalid counting state.

* * * * *